(12) United States Patent
Gustafsson

(10) Patent No.: US 10,913,357 B2
(45) Date of Patent: Feb. 9, 2021

(54) METHOD AND SYSTEM FOR MONITORING ELECTRICAL INSULATION RESISTANCE IN AN ELECTRIC SYSTEM

(71) Applicant: VOLVO TRUCK CORPORATION, Gothenburg (SE)

(72) Inventor: Tomas Gustafsson, Mölndal (SE)

(73) Assignee: VOLVO TRUCK CORPORATION, Gothenburg (SE)

(*) Notice: Subject to any disclaimer, the term of this patent is extended or adjusted under 35 U.S.C. 154(b) by 73 days.

(21) Appl. No.: 16/063,181

(22) PCT Filed: Dec. 22, 2015

(86) PCT No.: PCT/EP2015/081028
§ 371 (c)(1),
(2) Date: Jun. 15, 2018

(87) PCT Pub. No.: WO2017/108107
PCT Pub. Date: Jun. 29, 2017

(65) Prior Publication Data
US 2019/0001821 A1 Jan. 3, 2019

(51) Int. Cl.
*B60L 3/00* (2019.01)
*B60L 9/00* (2019.01)
(Continued)

(52) U.S. Cl.
CPC .............. *B60L 3/0069* (2013.01); *B60L 9/00* (2013.01); *G01R 27/02* (2013.01); *G01R 27/025* (2013.01);
(Continued)

(58) Field of Classification Search
CPC ....... B60L 3/0069; B60L 9/00; G01R 27/025; G01R 27/02; G01R 31/007; G01R 31/1272
(Continued)

(56) References Cited

U.S. PATENT DOCUMENTS 5,760,448 A 6/1998 Maeda
6,617,972 B2 * 9/2003 Takarada ........... G08B 21/0484
324/538
(Continued)

FOREIGN PATENT DOCUMENTS

DE 102014205877 A1 10/2015
JP 2012223020 A 11/2012
(Continued)

OTHER PUBLICATIONS

Japanese Office Action dated Dec. 3, 2019 in JP Application No. 2018-533109, 6 pages.
(Continued)

*Primary Examiner* — Giovanni Astacio-Oquendo
(74) *Attorney, Agent, or Firm* — Venable LLP; Jeffri A. Kaminski

(57) ABSTRACT

A method for monitoring electrical insulation resistance in an electric system includes: supplying electric power from an external power supply via a first conductor and a second conductor; feeding the electric power to the electric system via a first current collector and a second current collector, each of which are configured to be electrically connected to the electric system via a first main contactor and a second main contactor, respectively; and monitoring the insulation resistance by means of an insulation resistance monitoring unit associated with a control unit and connected to each of the main contactors. The method further includes: maintaining the main contactors in a closed state when the current collectors are disconnected from the conductors, thereby allowing monitoring of the insulation resistance; opening the main contactors and subsequently connecting the current collectors to the conductors; and closing the main contactors thereby allowing monitoring of the insulation resistance. An (Continued)

arrangement for monitoring electrical insulation resistance in an electric system is also provided.

16 Claims, 7 Drawing Sheets

(51) Int. Cl.
    *G01R 27/02*     (2006.01)
    *G01R 31/00*     (2006.01)
    *G01R 31/12*     (2020.01)

(52) U.S. Cl.
    CPC ....... *G01R 31/007* (2013.01); *G01R 31/1272* (2013.01)

(58) Field of Classification Search
    USPC .......................................... 324/503, 504, 500
    See application file for complete search history.

(56) References Cited

U.S. PATENT DOCUMENTS

| | | | | |
|---|---|---|---|---|
| 8,779,729 | B2* | 7/2014 | Shiraishi | G06F 1/3212 320/155 |
| 2009/0002903 | A1 | 1/2009 | Uchida | |
| 2011/0148428 | A1* | 6/2011 | Lasson | G01R 27/18 324/503 |
| 2012/0098518 | A1* | 4/2012 | Unagami | G01R 22/066 324/74 |
| 2013/0221997 | A1 | 8/2013 | Garcia Alvarrez et al. | |
| 2014/0021961 | A1* | 1/2014 | Yamada | G01R 31/52 324/503 |
| 2014/0152224 | A1 | 6/2014 | Enomoto et al. | |
| 2016/0202301 | A1* | 7/2016 | Mizoguchi | G01R 31/50 324/503 |
| 2016/0252555 | A1* | 9/2016 | Deumal Herraiz | G01R 35/00 324/503 |
| 2017/0141569 | A1* | 5/2017 | Liu | G01R 27/18 |
| 2017/0160333 | A1* | 6/2017 | Kawanaka | G01R 27/025 |
| 2018/0252754 | A1* | 9/2018 | Mochizuki | G01R 27/18 |

FOREIGN PATENT DOCUMENTS

| | | |
|---|---|---|
| JP | 2014131486 A | 7/2014 |
| JP | 2014195372 A | 10/2014 |
| WO | 2015032546 A1 | 3/2015 |

OTHER PUBLICATIONS

International Search Report (dated Sep. 6, 2016) for corresponding International App. PCT/EP2015/081028.

* cited by examiner

METHOD AND SYSTEM FOR MONITORING ELECTRICAL INSULATION RESISTANCE IN AN ELECTRIC SYSTEM

BACKGROUND AND SUMMARY

The present invention relates to a method for monitoring electrical insulation resistance in an electric system. The method comprises: supplying electric power from an external power supply via a first conductor and a second conductor; feeding said electric power to the electric system via a first current collector and a second current collector, each of which are configured to be electrically connected to said electric system via a first main contactor and a second main contactor, respectively; and monitoring said insulation resistance by means of an insulation resistance monitoring unit associated with a control unit and connected to each of said main contactors.

The invention also relates to an arrangement for monitoring electrical insulation resistance in an electric system and connected to an external power supply via a first conductor and a second conductor. The arrangement comprises a first current collector and a second current collector, each being configured to be electrically connected to said conductors and for feeding said electric power to the electric system via a first main contactor and a second main contactor, and an insulation resistance monitoring unit associated with a control unit and connected to each of said main contactors for monitoring said insulation resistance.

The invention can be applied in vehicles, such as cars, trucks, buses and construction equipment.

Although the invention will be described below with respect to an application in the form of an electrically powered bus, the invention is not restricted to this particular type of vehicle, but may be used in other vehicles. The vehicles can be electric vehicles or hybrid electric vehicles.

In the field of vehicles, it has become more common to use alternative power sources, i.e. as alternatives to conventional internal combustion engines. In particular, electrically operated vehicles has emerged as a promising solution.

An electrically operated vehicle can be propelled by means of an electric machine solely, or by means of an arrangement comprising both an electric machine and an internal combustion engine. The latter type is referred to as a hybrid vehicle (HEV), and can be used in a manner in which the internal combustion engine is used for operating the vehicle while driving outside urban areas, whereas the electric machine is used in urban areas or in environments in which there is a need to limit the discharge of harmful pollutants such as carbon monoxide and oxides of nitrogen. Furthermore, a hybrid vehicle employs an electrical energy storage system with a rechargeable battery pack which provides electric power to the electric machine.

There exist other types of vehicles, for example trams and trains i.e. track-hound vehicles which run in tracks laid out on the ground) and buses and transport vehicles (which are normally not track-bound) which may be operated by means of a traction unit such as an electric machine. Such vehicles may be powered through an overhead current conductor, i.e. an electric contact wire, which forms part of an external power supply which supplies electric power to the electric machine in the vehicle. For this reason, the vehicle is provided with a current collector, such as for example a pantograph, which is positioned on the roof of the vehicle and is configured for being in contact with said current conductor during operation. In these types of vehicles there is normally no need for any rechargeable battery pack since the electric machine is powered continuously during operation of the vehicle.

In summary, a vehicle with an electric machine—either a vehicle using an electric machine solely or a hybrid vehicle—needs to be supplied with electric power from an external power supply. The electric power is used either for charging an energy storage system or for direct propulsion of the vehicle. Furthermore, the external power supply can be in the form of the common electric grid power system which can be accessed via for example a conventional overhead current conductor, as mentioned above. Alternatively, the external power supply can be a stand-alone unit particularly adapted as a power supply to vehicles.

The external power supply provides electric power to an onboard electric system, the purpose of which is to control certain electrical functions of the vehicle, in particular in order to control the operation of the electrical machine.

For vehicles with electric arrangements of the above-mentioned kind, it is of high importance to monitor the electrical insulation resistance of the onboard electric system. More precisely, the insulation resistance between, for example, two overhead conductors must be monitored and carefully analyzed. The general purpose of insulation resistance monitoring is to provide a control function which indicates the status of the electric system of the vehicle, in particular for controlling that specifications are met and for identifying any malfunctioning components which may need to be replaced. For example, insufficient electric insulation resistance due to improper insulation or grounding may give rise to defective components and may also be a safety hazard.

In a situation involving a vehicle having an electric machine and being powered by an external power supply, it is normally necessary to monitor both the insulation resistance of the on-board electric system, i.e. a first electric net, and also between the current collectors which are connected to said external power supply, i.e. a second electric net. It is previously known to monitor the insulation resistance of an electric system using an insulation resistance monitoring unit being associated with the first electric net and a further insulation resistance monitoring unit being associated with the second electric net. The fact that different insulation resistance monitoring units are used for the two different nets is based on the insight that if multiple monitoring units are connected to the same net they may disturb each other's measurements.

For this reason, a previous solution is to use relay devices which are configured to physically disconnect one monitor unit if multiple monitored electric nets are connected together. However, this will result in additional components and added cost. Also, it may result in an uncertainty as to whether a particular insulation monitor disconnection relay is really closed. If not, a potential insulation failure may not be detected accurately.

Based on the above-mentioned drawback, a problem associated with the prior art is to reduce the number of necessary insulation detection devices, thereby reducing cost and complexity of such a system.

Furthermore, the patent document JP 2012-223020 teaches a system for monitoring the electric insulation resistance in a vehicle having contactors between the vehicle and a pantograph which can be connected to an external power supply. Furthermore, an electrical insulation detecting, means is connectable to the pantograph. However, even though JP 2012-223020 is directed to the field of insulation resistance monitoring, there is a continuing need for improved methods and systems by means of which the insulation resistance can be monitored in several electric nets using a low number of insulation monitor units while still providing accurate monitoring.

It is desirable to provide an improved method and system for insulation resistance monitoring involving cost-effective and accurate measurement methods and arrangements.

A method for monitoring electrical insulation resistance in an electric system according to an aspect of the present invention comprises: supplying electric power from an external power supply via a first conductor, and a second conductor; feeding said electric power to the electric system via a first current collector and a second current collector, each of which are configured to be electrically connected to said electric system via a first main contactor and a second main contactor, respectively; and monitoring said insulation resistance by means of an insulation resistance monitoring unit associated with a control unit and connected to each of said main contactors. The method further comprises: maintaining said main contactors in a closed state when the current collectors are disconnected from said conductors, thereby allowing monitoring of the insulation resistance; opening said main contactors and subsequently connecting the current collectors to the conductors; and closing said main contactors, thereby allowing monitoring of the insulation resistance.

By means of an aspect of the invention, certain advantages are obtained. Primarily, it can be mentioned that an improved method for insulation resistance monitoring is obtained since it provides accurate and cost-effective monitoring with a minimum number of components.

According to an embodiment, the method comprises a step of activating a pre-charge unit after the step of connecting the current collectors to the conductors but before said step of closing the main contactors. This means that the pre-charge unit can be used to provide a special start-up mode of the electric system in which the current from the power from the external power supply is initially limited. In this manner, the contactors and other electric components can be protected. According to an embodiment, the method comprises a step of activating the pre-charge unit by closing a switch being connected in parallel with said second main contactor.

Furthermore, according to an embodiment, the method comprises a step of supplying electric power from the external power supply via a first overhead voltage line and a secant, overhead voltage line, or via conductors arranged along the ground. The vehicle is consequently provided with electric power in an efficient manner from suitable conductor arrangements during operation of the electric system. According to a particular embodiment, the invention comprises feeding electric power to the electric system by means of a first pantograph and a second pantograph. The pantographs are robust and efficient devices for collecting current on vehicles of different types.

An arrangement for monitoring electrical insulation resistance in an electric system and connected to an external power supply via a first conductor and a second conductor according to an aspect of the invention comprises a first current collector and a second current collector each being configured to be electrically connected to said conductors and for feeding said electric power to the electric system via a first main contactor and a second main contactor, and an insulation resistance monitoring unit associated with a control unit and connected to each of said main contactors for monitoring said insulation resistance. Furthermore, the control unit is configured for maintaining said main contactors in a closed state while the current collectors are disconnected from said conductors, thereby monitoring of the insulation resistance; for opening said main contactors and subsequently connecting the current collectors to the conductors; and for closing said main contactors, thereby monitoring the insulation resistance.

Further advantages and advantageous features of the invention are disclosed in the following description and in the dependent claims.

BRIEF DESCRIPTION OF THE DRAWINGS

With reference to the appended drawings, below follows a more detailed description of embodiments of the invention cited as examples.

DETAILED DESCRIPTION

Different aspects of the present disclosure will be described more fully hereinafter with reference to the enclosed drawings. The method and system disclosed herein can, however, be realized in many different forms and should not be construed as being limited to the aspects set forth herein.

Figure 1:
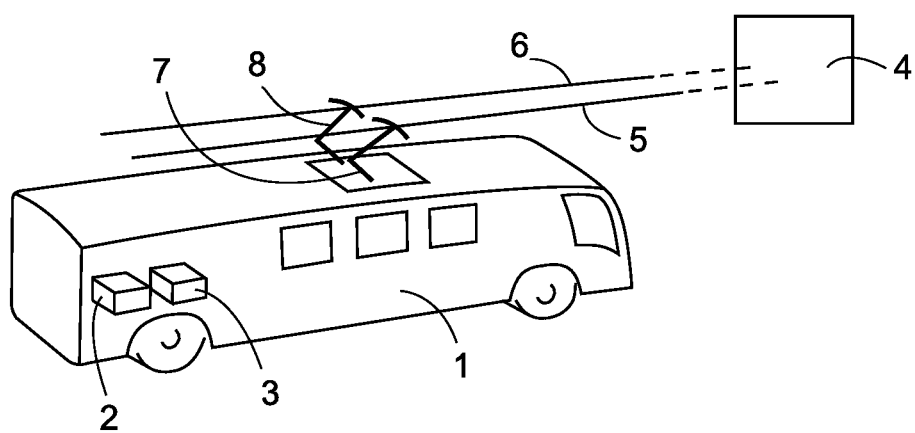
FIG. 1 shows a simplified perspective view of a vehicle in which the present invention can be used.

With initial reference to FIG. 1, there is shown a simplified perspective view of a vehicle in the form of a bus 1 which according to the embodiment is configured to be operated by means of an electric machine 2. Furthermore, the electric machine 2 is associated with an on-board electric system 3 which is schematically shown in FIG. 1 and which will be described in greater detail below.

The purpose of the electric system 3 is to control the electric propulsion of the vehicle 1 by distributing electric energy in a suitable manner, and also to control the operation of the electric machine 2 and other relevant components. Furthermore, the electric system 3 is arranged for providing electric power to other auxiliary electric components in the vehicle 1, such as heating and ventilation devices etc. For this purpose, the electric system 3 is powered by means of electric current from an external power supply 4. More precisely, the external power supply 4 comprises a first current conductor 5 and a second current conductor 6 which according to an embodiment are arranged as a pair of overhead conductors. The conductors 5, 6 are configured for conducting a charging current having a certain voltage. According to an embodiment, the nominal voltage between the first conductor 5 and the second conductor 6 is 600 V DC.

The conductors 5, 6 are connected to the electric system 3 via a first current collector 7 and a second current collector 8 which are arranged on the vehicle 1. The current collectors 7, 8 are according to an embodiment constituted by two pantographs which are mounted on the roof of the bus 1 and which are arranged for being brought into contact with the first, conductor 5 and the second conductor 6, respectively. In this manner, the on-board electric system 3 of the vehicle 1 can be supplied with electrical power, as will be further explained below.

It should be noted that FIG. 1 shows the vehicle 1 in a simplified form. According to an embodiment, the vehicle 1 is arranged to be operated by means of the electric machine 2 only. The manner in which an electric machine can be used in a vehicle for operating one or more wheels is previously known as such, and for this reason it is not described in greater detail here.

According to a further embodiment (which is not shown in the drawings), the vehicle may be a hybrid vehicle, for example of the so-called plug-in hybrid type which is equipped with an internal combustion engine and an electric machine which are connected to each other via a clutch. Both the internal combustion engine and the electrical machine can then be used alternately or in parallel to operate the vehicle. In the case of a hybrid type of vehicle, there is normally also provided a rechargeable electric energy storage system which comprises a battery pack. Furthermore, the invention can be used in vehicles which are powered by electric power only. In such case, the vehicle can be provided with a pantograph which is connected to an overhead conductor for charging a battery pack, so that the vehicle can be driven a certain distance without being connected to an external power supply.

The battery pack provides an output DC voltage having a desired voltage level. In an embodiment in which the vehicle comprises a chargeable battery pack, the vehicle can be arranged so that charging of the battery pack takes place while the vehicle is standing still, for example at a charging station such as for example at a bus terminal or a similar location. Alternatively, charging can be carried out during operation of the vehicle, in particular in the case where a pantograph is used for connecting the battery pack to an external power supply.

As mentioned, the vehicle 1 comprises an on-board electric system 3 which is configured to be fed with electric power from the external power supply 4 via the conductors 5, 6. The electric system 3 is furthermore arranged for transforming the incoming voltage on the conductors 5, 6 to a voltage which is suitable for the electric machine 2, normally 600 V AC, by means of an inverter. The electric system 3 is also configured for transforming the input voltage to a level which is suitable for auxiliary loads in the vehicle (for example heaters, ventilation devices etc.), normally 24 V DC. Furthermore, the electric system 3 is arranged for controlling the operation of the electric machine 2 and other components of the driveline of the vehicle 1. According to an embodiment, the pantographs 7, 8 and the overhead wires 5, 6 are arranged to be in contact during operation of the vehicle 1.

Even though this disclosure refers to a vehicle 1 in the form of a bus, the invention can generally be implemented in virtually any type of vehicle which is operated by Means of at least an electric machine. Such vehicles include cars, buses, trams, transport vehicles and trains.

Regarding the conductors, it cat be noted that they can be arranged as overhead wires. Alternatively, the invention can be implemented with conductors in the form of a current conducting power rail which is arranged along the road surface. Such an arrangement is configured to cooperate with one or more current collectors which are movable and lowered towards the ground, and which may be configured to be connected with said current conducting power rail during operation of the vehicle. The invention can also be implemented by means of other types of conductors, for example current wires arranged along the side of a vehicle and corresponding with suitable current collectors on the vehicle.

An embodiment of the invention will now be described in greater detail with reference to FIG. 2, which is a schedule of an arrangement 9 comprising the above-mentioned electric machine 2, the electric system 3, the current collectors 7, 8 and also certain further components which are provided for monitoring the electrical insulation resistance in said electric system 3.

As explained above, the external power supply 4 is provided with a first conductor 5 and a second conductor 6 which according to an embodiment constitute conductors for a voltage which is of the magnitude 600 V. The first current collector 7 is connected to a first input terminal of the electric system 3 via a first main contactor 10, whereas the second current collector 8 is connected to a second input terminal of the electric system 3 via a second main contactor 11. Each one of the main contactors 10, 11 constitutes a high-current relay containing a controllable switch. Both contactors 10, 11 are connected to a control unit 12 which is configured to control the condition of each switch.

According to an embodiment, a pre-charge unit 13 is connected in parallel with the second main contactor 11. The purpose of the pre-charge unit 13 is to initiate a start-up mode of the electric system 3 immediately when the current collectors 7, 8 are connected to the conductors 5, 6. During this start-up mode, it is of high importance to current-limit the supplied electric power from the external power supply 4 so that a controlled rise time of the input voltage during the initial phase is obtained. Without such a "pre-charge", the high voltage which is applied cross the contactors 10, 11 may cause an electric arc which may damage components of the contactors 10, 11 and the electric system 3. The purpose of the pre-charge unit 13 is consequently to limit the inrush current during the above-mentioned power-up phase.

In order to actuate the pre-charge unit 13, it comprises a pre-charge contactor 14 having a controllable switch which is connected in series with a resistor 15. The pre-charge contactor 14 is connected to the control unit 12 in a similar manner as the two above-mentioned contactors 10, 11.

Furthermore, the control unit 12 comprises an insulation resistance monitoring unit 16. The control unit 12 is connected to a chassis earth point, although this is not shown in the drawings. As mentioned initially, it is important to monitor the insulation resistance being associated with the on-board electric system 3 and the pantographs 7, 8. For this reason, the insulation resistance monitoring unit 16 is configured in a manner so as to ensure that the electric insulation between the two pantographs 7, 8 and ground, alternatively between the input terminals of the electric system 3 and ground, is sufficiently high. This is obtained by means of the insulation resistance monitoring unit 16, which is configured for measuring, the insulation resistance. In practical terms, this means that the insulation resistance should be as close to infinite as possible. Through this monitoring of the insulation resistance, it can be determined whether the electric system 3 or the pantographs 7, 8 contain any defective components, improper electric insulation, inadvertent grounding or shorting or similar electric defects. The insulation resistance monitoring unit 16 can be configured to initiate an emergency signal if the detected insulation resistance is lower than a predetermined threshold value.

The insulation resistance monitoring unit 16 is associated with the control unit 12, and during connection and disconnection of the pantographs 7, 8 to the conductors 5, 6, the control unit 12 is configured to open and close the switches which form part of the first main contactor 10, the second main contactor 11 and pre-charge unit 13. For this purpose, the control unit 12 is also configured for controlling the positions of the pantographs 7, 8, i.e. in a manner so that they can be electrically connected to, and disconnected from, the conductors 5, 6. It should be noted that FIG. 2 shows the pantographs 7, 8 in a condition in which they are disconnected from the conductors 5, 6. The process for controlling the pantographs 7, 8 so as assume to their connected and disconnected conditions, and also for controlling the first main contactor 10, the second main contactor 11 and the pre-charge unit 13 is carried out by means of the control unit 12 according to a particular sequence which will now be described.

Figure 2:
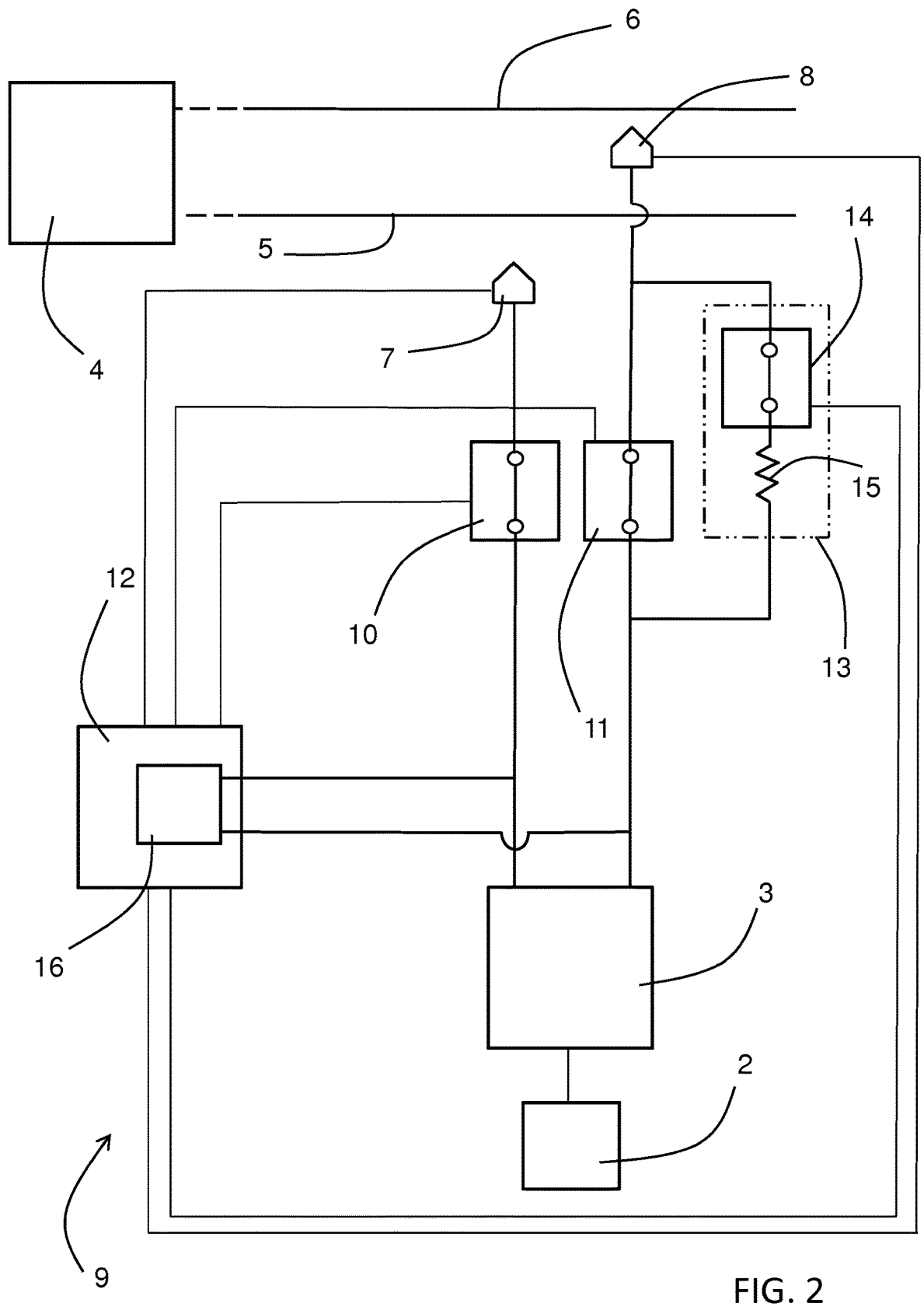
FIG. 2 is a schematic view of an arrangement for monitoring electrical insulation resistance according to an embodiment of the invention.

As indicated in FIG. 2, electric power is supplied from the first conductor 5 and a second conductor 6 so as to feed the electric system 3 via the first current collector 7 and via the second current collector 8. The collectors 7, 8, which according to an embodiment are constituted by pantographs, are connected to the electric system 3 via a first main contactor 10 and a second main contactor 11, respectively. FIG. 2 shows a condition in which the current collectors 7, 8 are disconnected from the two conductors 5, 6. In this condition, the first main contactor 10 and the second main contactor 11 are in their closed condition and the insulation resistance of the electric system 3, including the current collectors 7, 8, is monitored. According to the embodiment in FIG. 2, the pre-charge contactor 14 is also closed. As long as the main contactors 10, 11 are maintained in their closed condition, monitoring of the insulation resistance of the electric system 3 is upheld.

Figure 3:
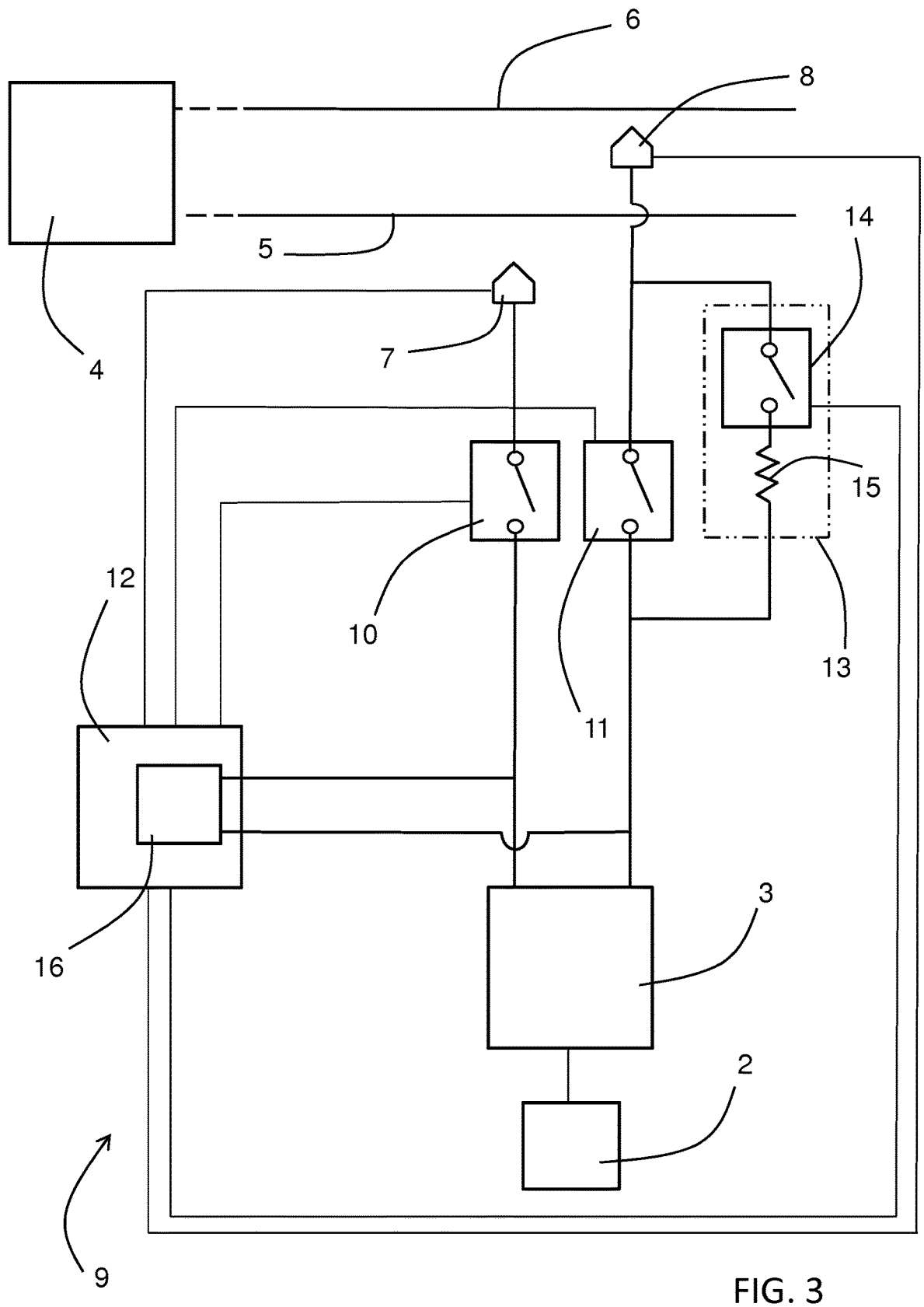
FIG. 3 is a schematic view which corresponds to FIG. 2, but which shows the arrangement in a first alternative operating condition.
Figure 4:
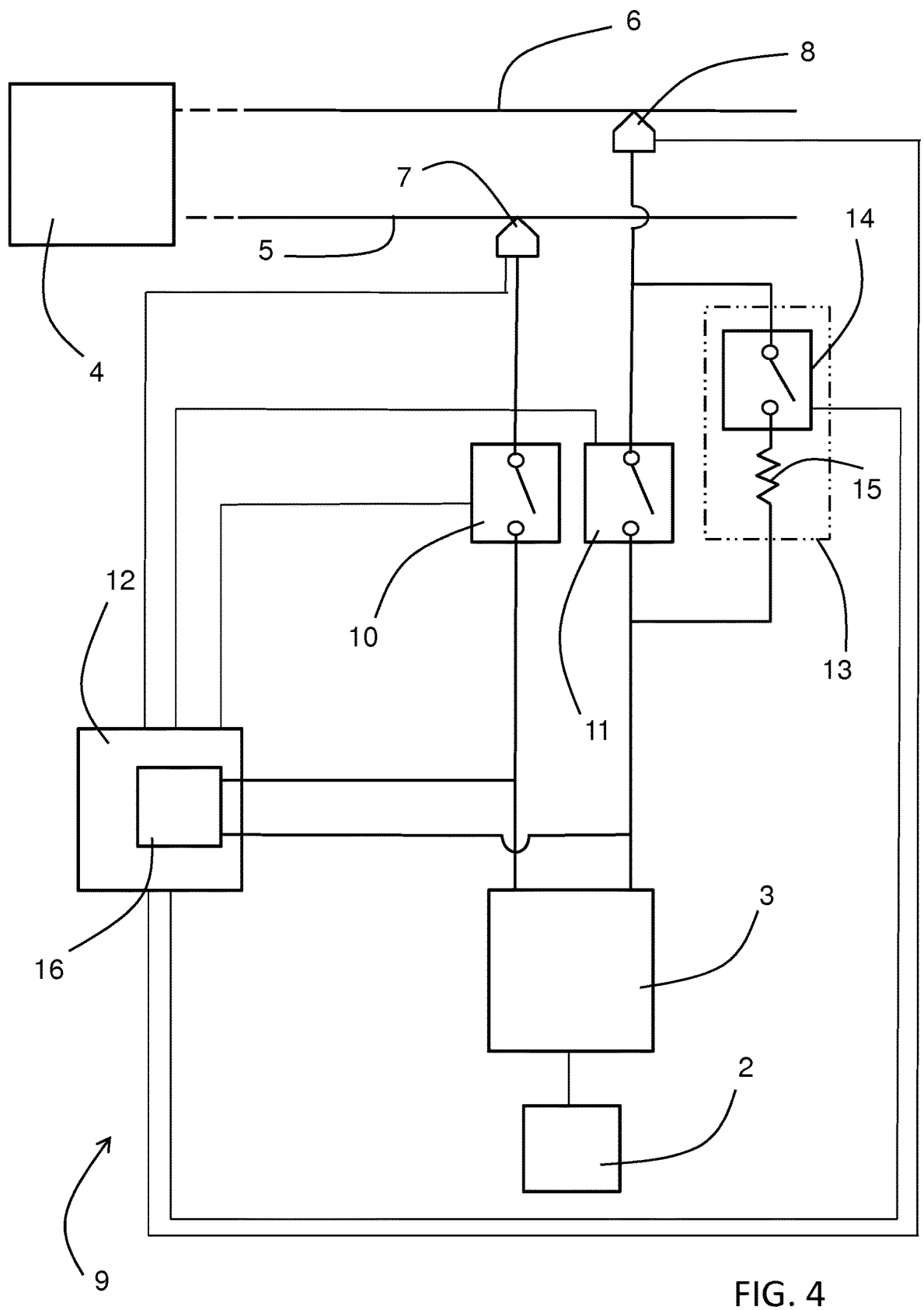
FIG. 4 is a schematic view which corresponds to FIG. 2, but which shows the arrangement in a second alternative operating condition.

When there is a desire to connect the electric system 3 to the external power supply, the main contactors 10, 11 are set in their open condition. This is shown in FIG. 3, which also shows that the pre-charge contactor 14 is set in its open condition. The next step is shown in FIG. 4, i.e., the current collectors 7, 8 are then connected to the corresponding conductors 5, 6 through control by means of the control unit 12 while the contactors 10, 11, 14 are maintained in their open condition.

Figure 5:
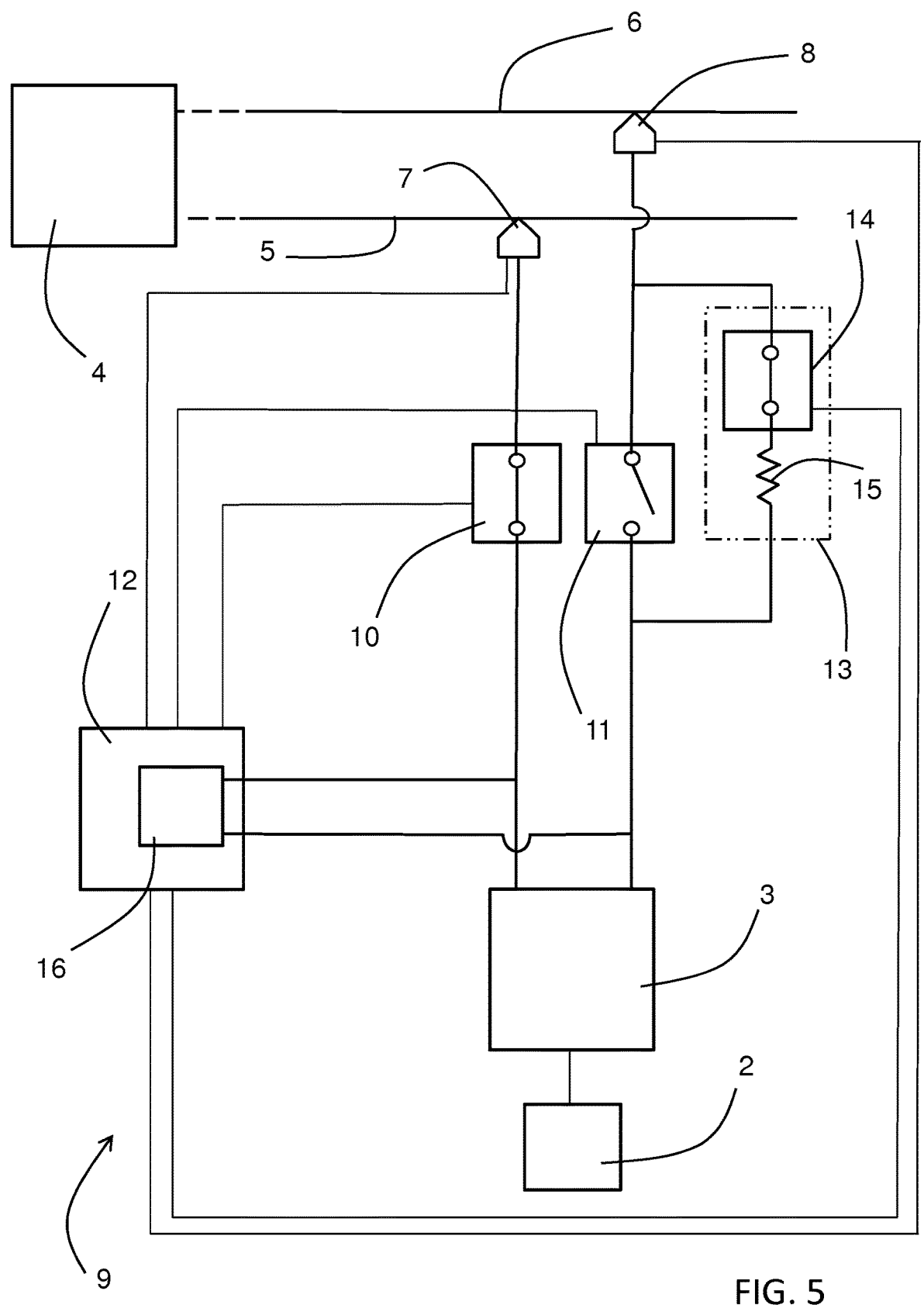
FIG. 5 is a schematic view which corresponds to FIG. 2, but which shows the arrangement in a third alternative operating condition.

Subsequently, according to the embodiment shown in FIG. 5, the pre-charge contactor 14 is closed together with the first main contactor 10, thereby initiating a pre-charge phase which, as described above, is intended to limit the electric power which is supplied from the external power supply 4 so that a controlled rise time of the input voltage is obtained during the pre-charge phase. More precisely, the closing of the pre-charge contactor 14 connects the resistor 15 in parallel with the second lain contactor 11.

Figure 6:
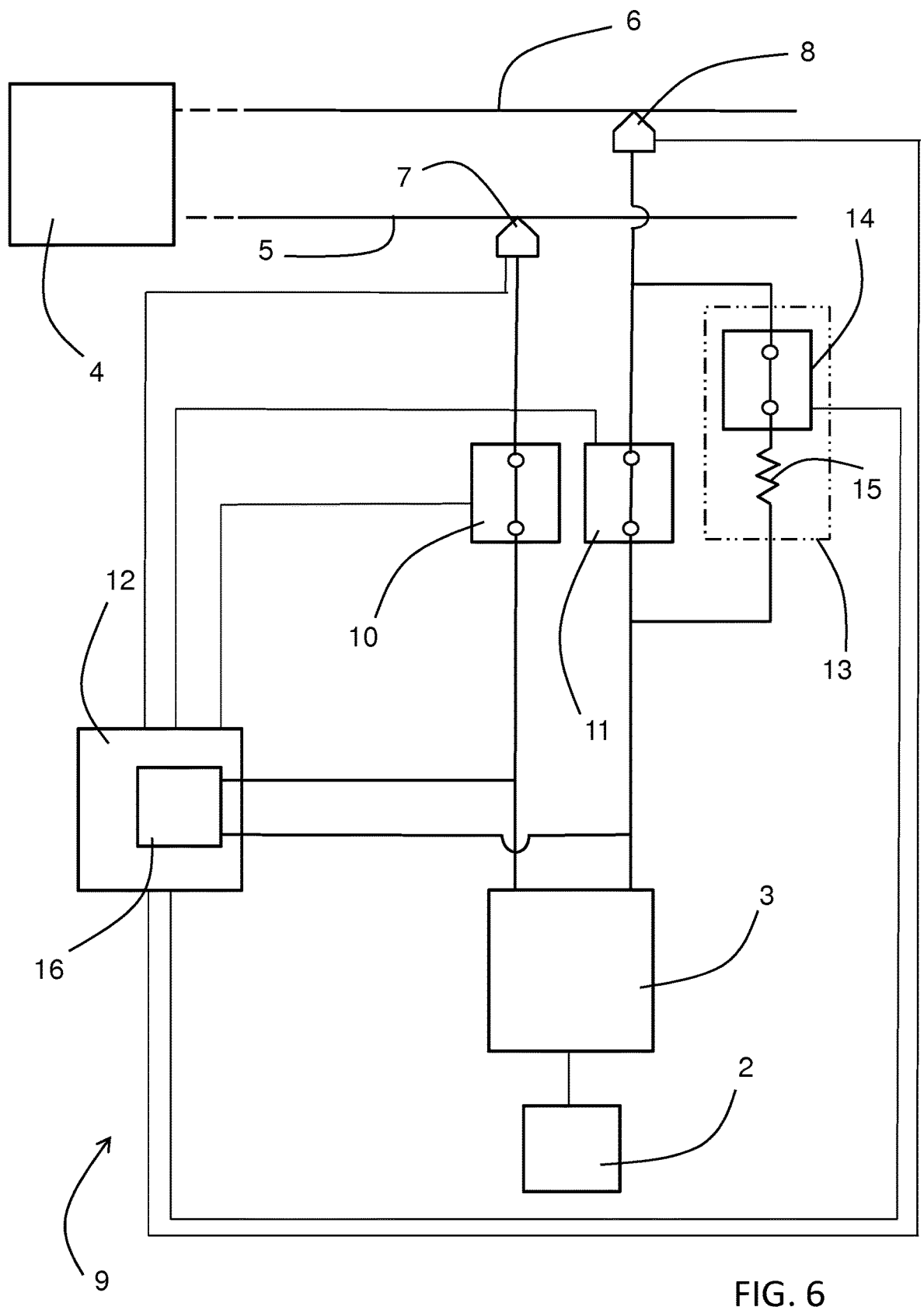
FIG. 6 is a schematic view which corresponds to FIG. 2, but which shows the arrangement in a fourth alternative operating condition.

The next step is shown in FIG. 6, in which the second main contactor 11 is closed, which ends the pre-charge phase and connects both conductors 5, 6 to the on-board electric system 3. In this condition, there is also a monitoring of the insulation resistance during operation of the electric system 3.

Disconnection of the electric system 3 from the external power supply 4 is carried out in the opposite way. Firstly, the main contactors 10, 11 and the pre-charge contactor 14 are set in their open condition. Next, the current collectors 7, 8 are disconnected from the conductors 5, 6. Finally, the main contactors 10, 11 and the pre-charge contactor 14 are set in their closed condition in order to monitor the electric insulation resistance.

Figure 7:
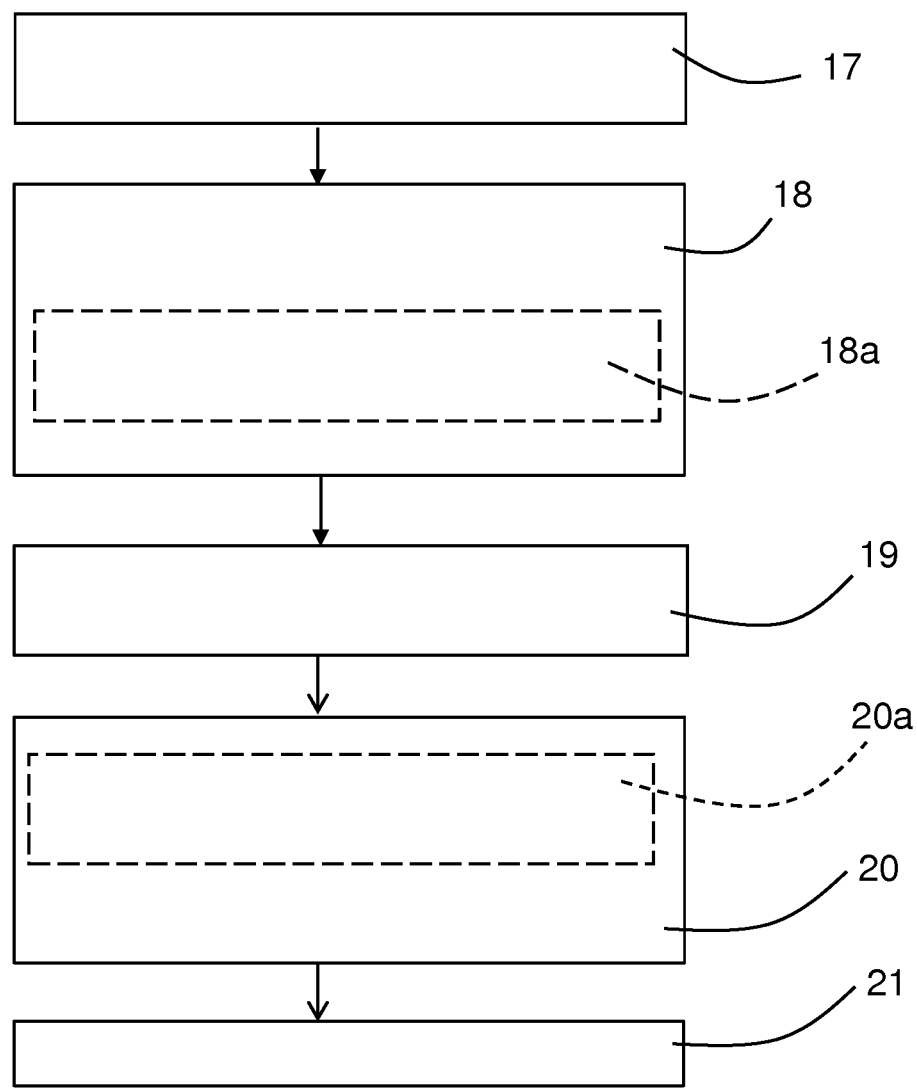
FIG. 7 is a flowchart illustrating the operation of an embodiment of the invention.

FIG. 7 is a flowchart showing the procedure according to an embodiment of the invention. Initially, the system is in a condition in which the external power supply 4 is not connected to the on-board electric system 3 (indicated as "step 17" in FIG. 7). This operating condition corresponds to the disclosure of FIG. 2, i.e. the insulation resistance of the electric system 3 is monitored.

Next, the main contactors 10, 11 are set in their open condition (step 18) as a preparation for connecting the electric system 3 to the external power supply 4. In an embodiment in which the arrangement 9 comprises a pre-charge unit 13, the pre-charge contactor 14 is also set in its open condition during this phase (step 18a).

Next, the first current collector 7 and the second current collector 8 are connected to the first conductor 5 and the second conductor 6, respectively (step 19). This is carried out while the contactors 10, 11, 14 are maintained in their open position.

The next step of the process is that the first main contactor 10 is closed (step 20). Optionally, in the embodiment comprising a pre-charging unit 13, the pre-charge contactor 14 is also closed (step 19a), after which the second main contactor 11 is closed. In this manner, a continuing monitoring of the insulation resistance is obtained during operation of the electric system 3 and the vehicle 1 (step 21).

Disconnection of the current collectors 7, 8 from the external power supply 4 is carried out in the opposite way, as explained above.

It is to be understood that the present invention is not limited to the embodiments described above and illustrated in the drawings; rather, the skilled person will recognize that many changes and modifications may be made within the scope of the appended claims.

For example, the embodiment shown in FIGS. 2-6 includes the above-mentioned pre-charge unit 13. However, it should be noted that the invention is not limited to such an embodiment only may include or exclude such a pre-charge unit.

Furthermore, the invention can be used both with electric conductors in the form of overhead wires, as described above, or with conductors arranged at ground level, such as electrically conductive rails or tracks. In the latter case, the current collectors used are in the form of movable contacts which during operation are continuously in contact with the conductor rails. The invention can also be implemented with wires arranged along the side of the vehicle.

Also, the invention is suitable both for vehicles having current collectors which are continuously in contact with an eternal power supply, and for those vehicles which use a rechargeable battery system which is charged at certain time intervals.

Finally, the invention can be implemented both in electric vehicles of the kind which are rail-bound and those which are not.

The invention claimed is:

1. Arrangement for monitoring electrical insulation resistance in an electric system and connected to an external power supply via a first conductor and a second conductor, the arrangement comprising a first current collector and a second current collector each being configured to be electrically connected to the conductors and for feeding the electric power to the electric system via a first main contactor and a second main contactor, and an insulation resistance monitoring unit associated with a control unit and connected to each of the main contactors for monitoring the insulation resistance; wherein the control unit is configured for maintaining the main contactors in a closed state while the current collectors are disconnected from the conductors thereby monitoring of the insulation resistance; for opening the main contactors and subsequently connecting the current collectors to the conductors; and for closing the main contactors, thereby monitoring the insulation resistance.

2. Arrangement according to claim 1, wherein it comprises a pre-charge unit with a controllable switch and a resistance in series, the pre-charge unit being coupled in parallel with the second main contactor.

3. Arrangement according to claim 1, wherein the electric system is constituted by a voltage supply system in a vehicle.

4. Arrangement according to claim 1, wherein each one of the first current collector and the second current collector is constituted by a pantograph.

5. A vehicle comprising an arrangement for monitoring electrical insulation resistance in an electric system according to claim 1.

6. A method for monitoring electrical insulation resistance in an electric system, the method comprising: supplying electric power from an external power supply via a first conductor and a second conductor; feeding the electric power to the electric system via a first current collector and a second current collector, each of which are configured to be electrically connected to the electric system via a first main contactor and a second main contactor, respectively; and monitoring the insulation resistance by means of an insulation resistance monitoring unit associated with a control unit and connected to each of the main contactors; maintaining the main contactors in a closed state when the current collectors are disconnected from the conductors thereby allowing monitoring of the insulation resistance; opening the main contactors and subsequently connecting the current collectors to the conductors; and closing the main contactors, thereby allowing monitoring of the insulation resistance.

7. Method according to claim 6, wherein the method further comprises: activating a pre-charge unit after the step of connecting the current collectors to the conductors but before the step of closing the main contactors.

8. Method according to claim 7, wherein the method further comprises: activating the pre-charge unit by closing a switch being connected in parallel with the second main contactor.

9. Method according to claim 6, wherein the method further comprises: monitoring electrical insulation resistance in an electric system in the form of a voltage supply system for a vehicle.

10. Method according to claim 6, wherein the method further comprises: supplying electric power from the external power supply via a first overhead voltage line and a second overhead voltage line, or via conductors arranged along the ground.

11. Method according to claim 6, wherein the method further comprises: feeding electric power to the electric system by means of a first pantograph and a second pantograph.

12. Method according to claim 6, wherein the method further comprises: controlling the main contactors by means of the control unit.

13. Method according to claim 6, wherein the method further comprises: maintaining the main contactors in a closed state when the current collectors are connected to the conductors, thereby allowing monitoring of the insulation resistance; opening the main contactors and subsequently disconnecting the current collectors to the conductors; and closing the main contactors, thereby allowing monitoring of the insulation resistance.

14. A computer comprising a computer program for performing the method steps of claim 6, when the program is run on the computer.

15. A non-transitory computer readable medium carrying a computer program for performing the steps of claim 6 when the program product is run on a computer.

16. A control unit for monitoring electrical insulation resistance in an electric system and being configured to perform the steps of the method according to claim 6.

* * * * *